United States Patent [19]

Kimata

[11] Patent Number: 4,803,709
[45] Date of Patent: Feb. 7, 1989

[54] ELIMINATION OF KTC NOISE IN A CHARGE COUPLED DEVICE

[75] Inventor: Masafumi Kimata, Itami, Japan

[73] Assignee: Mitsubishi Denki Kabushiki Kaisha, Itamik, Japan

[21] Appl. No.: 78,198

[22] Filed: Jul. 27, 1987

[30] Foreign Application Priority Data

Aug. 29, 1986 [JP] Japan .................. 61-204498

[51] Int. Cl.4 .................. G11C 19/28; H01L 29/78
[52] U.S. Cl. .................. 377/58; 377/60; 377/63; 357/24
[58] Field of Search .................. 377/58, 60, 61, 62, 377/63; 357/24; 358/213.15, 213.18, 213.26

[56] References Cited

U.S. PATENT DOCUMENTS

| | | | |
|---|---|---|---|
| 3,781,574 | 12/1973 | White et al. | 377/58 |
| 4,309,624 | 1/1982 | Hynecek et al. | 377/58 |
| 4,454,435 | 6/1984 | Burns | 377/60 |
| 4,499,497 | 2/1985 | Levine | 358/213.15 |
| 4,554,675 | 11/1985 | Miwada | 377/63 |
| 4,556,851 | 12/1985 | Levine | 377/60 |
| 4,567,525 | 1/1986 | Endo et al. | 358/213.26 |
| 4,608,606 | 8/1986 | Levine | 358/213.15 |
| 4,644,287 | 2/1987 | Levine | 377/63 |
| 4,661,788 | 4/1987 | Levine | 377/60 |
| 4,683,580 | 7/1987 | Matsunaga | 377/60 |
| 4,689,808 | 8/1987 | Moorman et al. | 358/213.18 |
| 4,698,686 | 10/1987 | Endo et al. | 358/213.18 |
| 4,716,317 | 12/1987 | Spierings | 358/213.26 |

OTHER PUBLICATIONS

White et al–"Characterization of Surface Channel CCD Image Arrays at Low Light Levels", IEEE Jounral of Solid State Circuits–vol. SC9–No. 1, Feb. 1974–pp. 1–13.

Kosonocky et al., "Design and Performance of Two–Phase Charge-Coupled Devices with Overlapping Polysilicon and Alumium Gates", Technical Digest 1973 International Electron Devices Mtg., pp. 123–125.

RCA Review, vol. 34, Mar. 1973, pp. 164–202, "Two–Phase Charge-Coupled Devices with Overlapping Polysilicon and Aluminum Gates", Kosonocky, et al.

Primary Examiner—John S. Heyman
Assistant Examiner—Tai V. Duong
Attorney, Agent, or Firm—Saidman, Sterne, Kessler & Goldstein

[57] ABSTRACT

An output circuit of a charge coupled device comprises a transistor (4, 5, 6) having a floating diffusion (5) provided to receive a series of signal charges from a charge transfer section. Each signal charge is transferred to the floating diffusion in synchronism with a drive clock applied to the charge transfer section. The transistor has a gate electrode (4) connected to receive a reset clock ($\phi R'$) applied at an interval longer than the period of the drive clock.

17 Claims, 5 Drawing Sheets

FIG. IA PRIOR ART
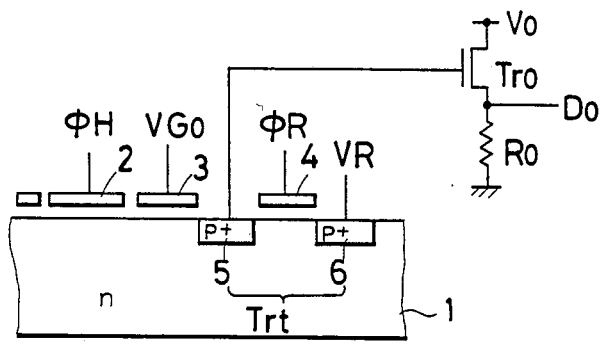
FIG. IB PRIOR ART
FIG. IC PRIOR ART
FIG. ID PRIOR ART
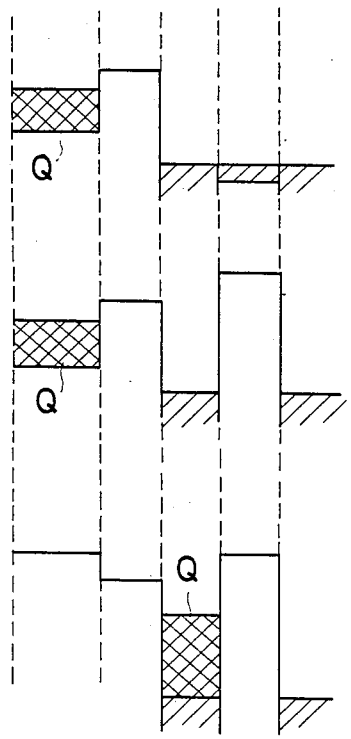

ELIMINATION OF KTC NOISE IN A CHARGE COUPLED DEVICE

BACKGROUND OF THE INVENTION

The present invention relates to a charge coupled device, and particularly to an improvement of an output circuit thereof.

FIG. 1A shows a prior art output circuit of a charge coupled device (CCD). It includes a semiconductor substrate 1 of a first conductivity type, gate electrodes 2, 3 and 4, and high-concentration impurity regions or heavily impurity-doped regions 5 and 6 of a second conductivity type, different from the first conductivity type. Applied to the gate electrode 2 is one phase φH of the drive clock. Applied to the gate electrode 3 is a DC voltage VGo. Applied to the gate electrode 4 is a reset clock φR. The impurity region 6 is connected to a reset power supply VR. The impurity region 5 is called a floating diffusion and is electrically connected to a gate electrode of a source-follower output transistor Tro formed on the same substrate 1. The drain of the transistor Tro is connected to a source-follower power supply Vo. The source of the transistor Tro, constituting the output terminal Do, is connected through a load resistor Ro to the ground. The gate electrode 4, the floating diffusion 5, and the impurity region 6 forms a MOS transistor in which the floating diffusion 5 and the impurity region 6 constitute the drain and the source, respectively.

FIG. 2 shows clock signals applied to the output circuit of FIG. 1A, and FIGS. 1B to 1D show potentials at various parts (coresponding in vertical alignment between FIG. 1A and FIGS. 1B to 1D) of FIG. 1A at times t1 to t3 to FIG. 2.

At time t1 in FIG. 2, the clock φH is high, a potential well is formed under the gate electrode 2, and a signal charge Q is stored, as shown in FIG. 1B. The clock oR is then high, and the MOS transistor Trt is on and the floating diffusion 5 and the gate electrode 4 of the transistor Tro is reset to Vro.

At time t2 in FIG. 2, the clock φR has fallen low, the MOS transistor Trt has been turned off, as shown in FIG. 1C. When the clock φR goes from high to low, the potential of the floating diffusion 5 is lowered due to capacitive coupling between the gate electrode 4 and the floating diffusion 5. While the clock φR is low, the node connected to the floating diffusion 5 is floating.

At time t3 in FIG. 2, the clock φH has fallen low, and the signal charge Q which has been stored in the potential well under the gate electrode 2 is transferred or injected to the floating diffusion 5, to change the mode potential of the floating diffusion 5, as shown in FIG. 1D. This potential change is read out by the source-follower transistor Tro.

The above-described output circuit has a problem in that a noise due to the on-resistance of the MOS transistor Trt is generated each time the floating diffusion 5 is reset. Details on such noises are described in an article, entitled "Two-Phase Charge-Coupled Devices with Overlapping Polysilicon and Aluminum Gates" by W. F. Kosonocky and J. E. Carnes, in RCA Review, Vol 34, March 1973, pp. 164 to 203.

The noise is called kTC noise, and is dependent on the capacitance of the floating diffusion 5. In the low signal range, this noise is the greatest factor determining the performance of the CCD. It is therefore desirable that this noise be eliminated or reduced to minimum.

A solution to this problem is a use of correlated double sampling as disclosed in an article entitled "Characterization of Surface Channel CCD Image Arrays at Low Light levels" by M. H. White, et al, in Journal of Solid-State Circuits, Vol. SC-9, No. 1, February 1974. But this arrangement requires high speed clocks.

SUMMARY OF THE INVENTION

An object of the invention is to eliminate the kTC noise thereby to improve the signal-to-noise ratio in the low signal range using the same output circuit configuration, and without resorting to high-speed clocks as is required in the correlated double sampling.

According to the invention, there is provided an output circuit of a charge coupled device comprising a first transistor (4, 5, 6) having a floating diffusion (5) provided to receive a series of signal charges from a charge transfer section, each signal charge being transferred to the floating diffusion in synchronism with a drive clock applied to the charge transfer section, the first transistor having a gate electrode (4) connected to receive a reset clock (φR'), the reset clock being applied to the gate electrode at an interval longer than the period of the drive clock.

With the arrangement described above, when the signal charge is sufficiently small compared with the saturation level, and the signal charges can be transferred or injected to the floating diffusion a number of times before a saturation occurs. Resetting is not effected after a number of repeated transfer operations of the signal charges to the floating diffusion. That is, the resetting is not effected each time the signal is output but the signal charges accumulated or added to the old signal during each interval between successive resetting operations. The signals representing respective signal charges transferred to the floating diffusion can be obtained by determining the difference between successive sample values if the sampling is effected upon each transfer of the signal charge to the floating diffusion.

BRIEF DESCRIPTION OF THE DRAWINGS

In the accompanying drawings:

FIG. 1A is a schematic diagram showing an ouput circuit of a prior art charge-coupled device;

FIGS. 1B to 1D are diagrams showing the potentials and electric charge, stored at various parts of the output circuit of FIG. 1A;

DESCRIPTION OF THE PREFERRED EMBODIMENTS

An embodiment of the invention will now be described with referrence to FIG. 3.

Figure 2:
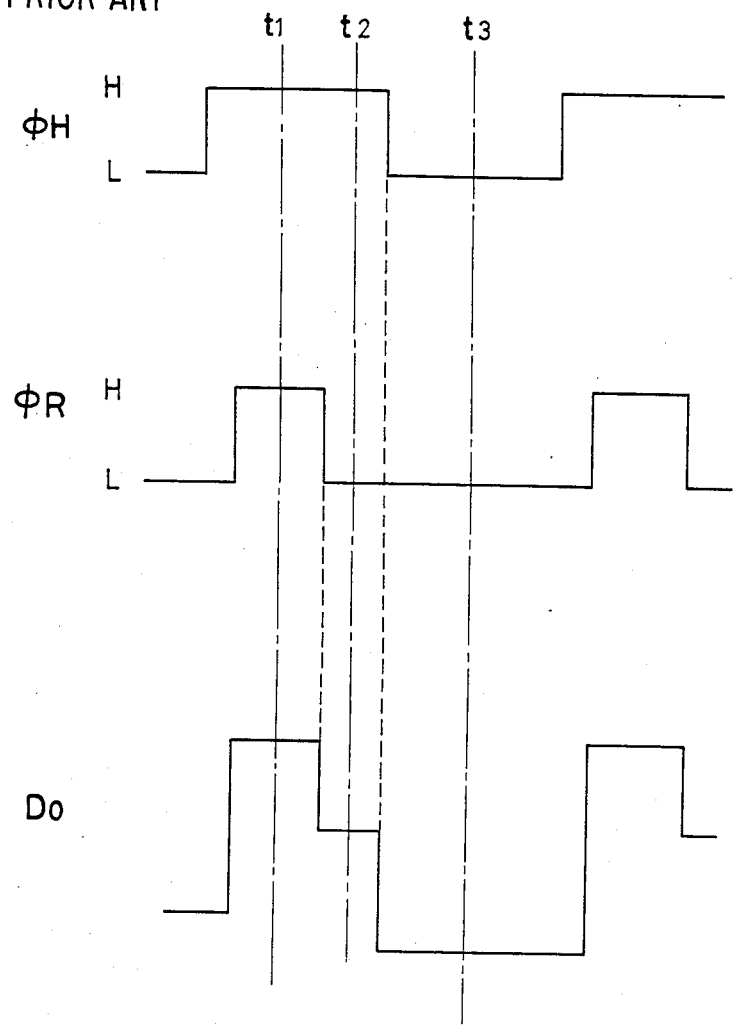
FIG. 2 is a time chart showing various signals appearing in the output circuit of FIG. 1A.
Figure 3:
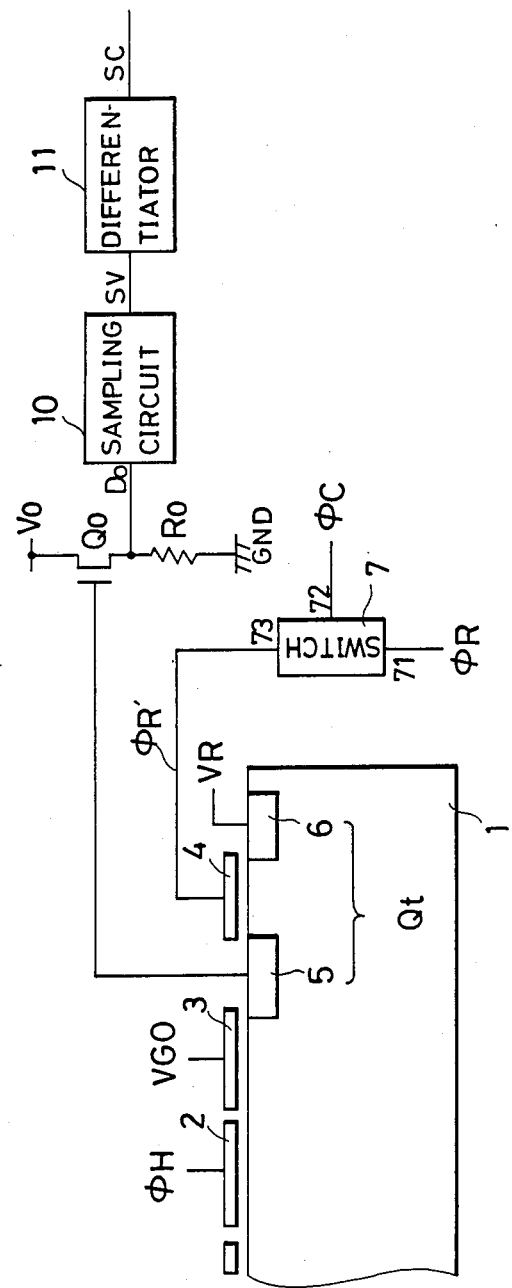
FIG. 3 is a schematic diagram showing an output circuit of a charge-coupled device of a first embodiment of the invention.

The device as shown in FIG. 3 is generally similar to the device shown in and described with reference to FIGS. 1A to 1D and FIG. 2. That is, it comprises a semiconductor substrate 1 of a first conductivity type, gate electrodes 2, 3 and 4, and high-concentration impurity regions or heavily impurity-doped regions 5 and 6 of a second conductivity type, different from the first conductivity type. The gate electrode 2 is the last stage of a charge transfer section of the charge-coupled device. Applied to the gate electrode 2 is one phase oH of the drive clock. Applied to the gate electrode 3 is a DC voltage VGo. The impurity region 6 is connected a reset power supply VR. The impurity region 5 is called a floating diffusion and is connected to a gate electrode of a source-follower output transistor Qo formed on the same substrate 1. The drain of the transistor Qo is connected to a source-follower power supply Vo. The source of the transistor Qo, constituting the output terminal Do, is connected through a load resistor Ro to the ground. The gate electrode 4, the floating diffusion 5 and the impurity region 6 form a MOS transistor Qt in which the floating diffusion 5 and the impurity region 6 constitute the drain and the source, respectively.

The device of FIG. 3 differs from the device of FIG. 1A in that there is provided a switch 7, through which a reset clock oR is supplied to the gate electrode 4. More specifically, the switch 7 has an input terminal 71 connected to receive the reset clock oR, has an output terminal 73 connected to the gate electrode 4, and has a control terminal 72 connected to receive a control clock oC. The switch 7 can for example be an AND gate receiving the reset clock oR and the control clock oC. The switch 7 can be formed on the substrate 1 or outside the substrate 1.

Figure 4:
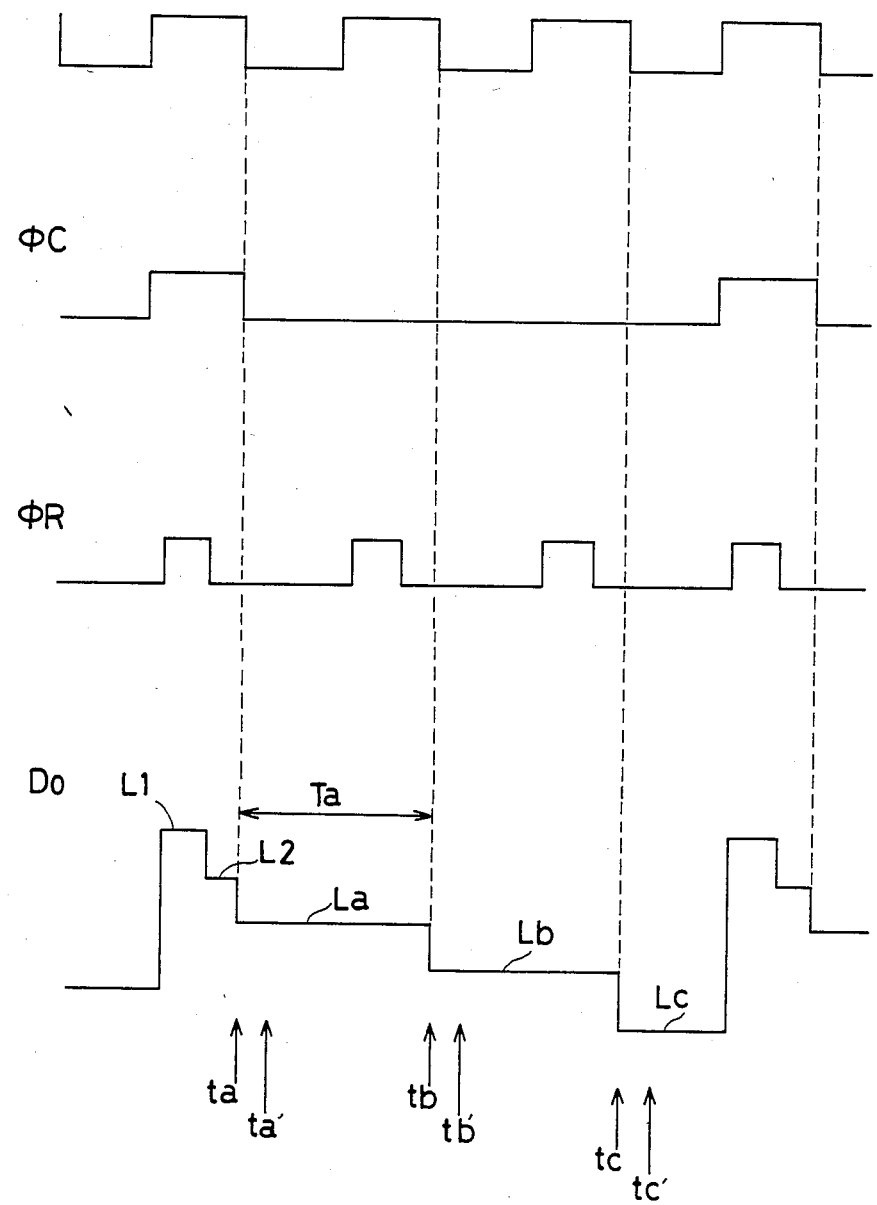
FIG. 4 is a time chart showing various signals appearing in the output circuit of FIG. 3.

A sampling circuit 10 samples the potential on the output terminal Do at a period of the drive pulse, each time the signal charge is transferred or injected to the floating diffusion 5, e.g., at ta', tb,' tc', shown in FIG. 4, and produces a succession of signals SV representing sample values.

A differentiator 11 receives the sample values SV and determines differences between successive sample values as output from the sampling circuit 10, thereby to determines the amount of the signal charges SC as transferred to the floating diffusion 5.

The operation of the device of FIG. 3 will now be described. FIG. 4 shows various signals appearing in the circuit of FIG. 3. The drive clock $\phi H$ and the reset clock $\phi R$ are produced in the same timing as in the device of FIG. 1A. The control clock $\phi C$ is applied every three cycles of the drive clock $\phi H$.

In the embodiment described, the drive clock $\phi H$ and the control clock $\phi C$ have identical pulsewidth. The control clock $\phi C$ may have a pulsewidth during which only one pulse of the reset clock $\phi R$ appears.

If a reset clock $\phi R$ is applied to the switch 7 while the clock $\phi C$ as input to the control terminal 72 of the switch 7 is at a high level, a high-level signal is produced at the output 73 of the switch 7, and is applied to the gate electrode 4 as a reset signal $\phi R'$. The output Do of the transistor Qo therefore rises to the highest level as indicated by a mark L1 in FIG. 4.

When the output 73 of the switch 7, which is a logical product of the clock $\phi r$ and the clock $\phi C$ goes low, the output potential Do is lowered a little to a level L2 in FIG. 4 due to the capacitive coupling between the gate electrode 4 and the floating diffusion 5.

When the clock $\phi H$ thereafter goes low at time ta, the electric charge A in the charge transfer part of the CCD is injected or read into the floating diffusion 5. The output level Do of the transistor Qo is lowered, by an amount corresponding to the injected signal charge A, to a level as shown by La in FIG. 4. The level of the output Do is maintained until time tb when the next signal charge B is read from under the gate 2 of the charge transfer section of the CCD into the floating diffusion 5: that is when the clock $\phi H$ subsequently goes low, after going high. Then the level of the output Do is lowered by an amount corresponding to the injected signal charge B, to a level Lb, which is mataintained until time tc when the next signal charge C is read out. Then the level of the output Do is lowered by an amount corresponding to the injected signal charge C to a level Lc.

When the clock $\phi C$ subsequently goes high and the reset clock $\phi R$ also goes high, the floating diffusion 5 and the output Do are reset.

In this way the reset clock $\phi R$ is combined with the control clock $\phi C$ to produce a reset clock $\phi R'$ that is applied to the gate electrode 4. In other words, the reset clock $\phi R'$ as applied to the gate electrode 4 is controlled by the control clock $\phi C$. Thus, the reset clock $\phi R'$ is applied to the gate electrode 4 once in three cycles of the drive clock $\phi H$, to reset the output Do of the transistor Qo. At time tb when the output level changes from La to Lb, and at time tc when the output level changes from Lb to Lc, the floating diffusion 5 is not reset and hence no kTC noise is produced.

By sampling the output Do at ta', tb' and tc', and determining the differences (La−L2), (Lb−La) and (Lc−Lb), signals representing the electric charges read out are obtained. That is the signals A, B and C representing the electric charges are given by:

A=La−L2

B=Lb−La

C=Lc−Lb

It is assumed that L2 is set at a reference, which may represents an optical black.

In this way, signals with smaller noise is produced.

No reductions of the kTC noise is attained at a time immediatly after the control clock $\phi C$ goes high, and the reset pulse $\phi R$ is input. But if the saturation of the output circuit is sufficiently large compared with the signal, the period of the control clock $\phi C$ can be made long e, g., more than three times the drive clock period. In an image sensor, which is a typical application of a CCD, part only of the pixels will have a noise level of the conventional device. The noise level throughout the entire screen can be reduced by making such an arrangement that the control clock $\phi C$ is not produced at identical pixels, i.e., at positions fixed relative to the screen of a display, i.e., the control clock oC is produced at timings corresponding to pixels different from one another from one frame to another. In this way, noises as observed on the screen can be significantly reduced.

Figure 5:
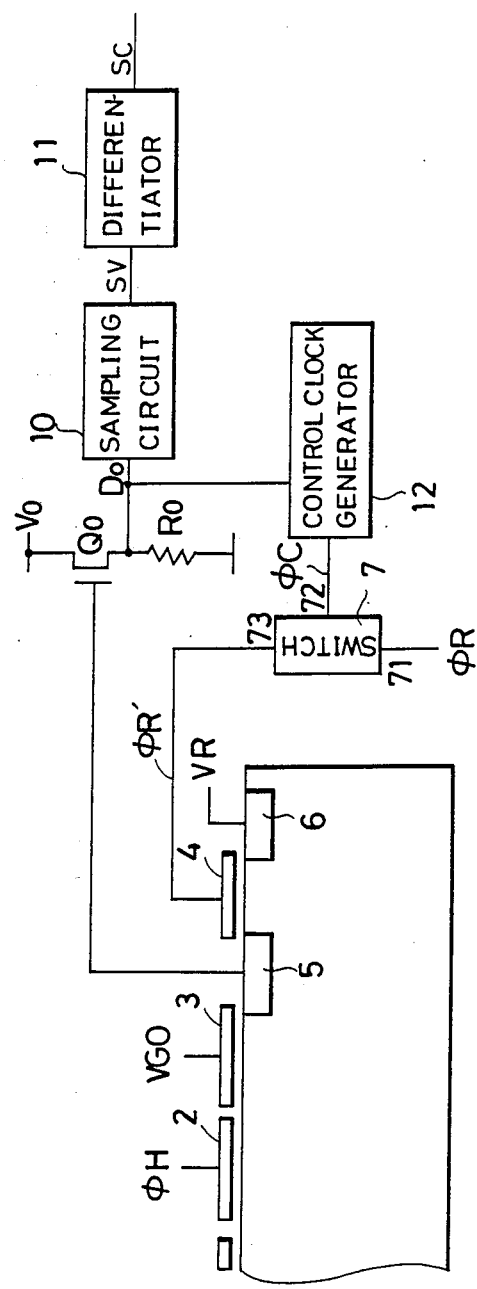
FIG. 5 is a schematic diagram showing an output circuit of a charge-coupled device of a second embodiment of the invention.

The control clock oC can be input at a fixed period which can be determined by the the expected signal level. Alternatively, the control clock oC can be input when the output level Do falls below a reference level. This can be implemented by providing a control clock generator 12, shown in FIG. 5, which monitors the level of the output Do and compares it with a reference level, thereby indirectly comparing the level of the floating diffusion 5 with a reference, and produces a reset clock $\phi R'$ each time the reference is reached.

The control clock generator 12 can be modified to vary the interval of the control clock and hence the reset clock in accordance with the potential on the output terminal Do, and hence the amount of signal charges transferred to the floating diffusion 5. For instance, an average, e.g., a rolling average, of a number of the signal charges transferred in succession can be determined and the interval of the control clock may be made longer as the average is smaller.

To further improve the S/N ratio, the sampling circuit 10 can be modified to sample the output Do once during each interval of resetting, after the last transfer within the interval and before the resetting at the end of the interval, i. e., within the period Tc in FIG. 4, so that one resetting produces one pixel in the output. The penalty is the reduction in the resolution. But this may be permitted in certain applications, such as an image sensor.

In the embodiment described, the reset clock $\phi R$ is applied through the switch 7 to the gate electrode 4, and the resetting is controlled by the control clock $\phi C$ applied to the switch 7. Other methods can be used to make the period of the reset clock $\phi R'$ to be larger than, or a multiple of the period of the drive clock $\phi H$.

As has been described, according to the invention, the resetting is effected at an interval longer than the period of the drive clock. The kTC noise produced at the time of resetting can be reduced, and a CCD having an improved S/N ratio can be obtained.

I claim:

1. An output circuit of a charge coupled device comprising a first transistor having a floating diffusion provided to receive a series of signal charges from a charge transfer section, each signal charge being transferred to the floating diffusion in synchronism with a drive clock applied to the charge transfer section, the first transistor having a gate electrode connected to receive a reset clock ($\phi R'$), and interval means for causing the reset clock (oR') to have an interval longer than the period of the drive clock.

2. A circuit according to claim 1, wherein the interval means is operable to cause the interval of application of the reset clock to be a multiple of the period of the drive clock.

3. A circuit according to claim 1, wherein the interval means is operable to vary the interval of application of the reset clock depending on the amount of the signal charges transferred to the floating diffusion.

4. A circuit according to claim 3, wherein the interval of the reset clock is made longer as the amount of the transferred signal charges is smaller.

5. A circuit according to claim 3, wherein the reset clock is applied to the gate electrode when the potential at the floating diffusion reaches a predetermined level.

6. A circuit according to claim 1, further comprising a second transistor having a gate electrode connected to the floating diffusion, and an output terminal for producing a potential corresponding to the potential of the floating diffusion.

7. A circuit according to claim 6, wherein the second transistor has a drain connected to a first power supply (Vo) and has a source connected through a resistor to a second power supply (GND) to form a source-follower circuit, the source of the second transistor constituting the output terminal.

8. A circuit according to claim 6, wherein the interval means further comprises means responsive to the potential at the output terminal for varying the interval of the reset clock.

9. A circuit according to claim 8, wherein said means responsive to the potential determines an average of a number of signal charges being transferred in succession, and makes the interval longer as the average is smaller.

10. A circuit according to claim 6, further comprising means responsive to the potential at the output terminal for producing the reset clock when the potential at the floating diffusion reaches a predetermined level.

11. A circuit according to claim 6, further comprising means for sampling the potential on the output terminal.

12. A circuit according to claim 11, wherein the sampling means carries out the sampling at the period of the drive clock, each time the signal charge is transferred to the floating diffusion.

13. A circuit according to claim 11, wherein the sampling means carries out the sampling at the interval of the reset clock, after the last transfer within the interval of the signal charge to the floating diffusion and before the application of the reset clock at the end of the said interval.

14. A circuit according to claim 6, wherein the floating diffusion constitutes the source of the first transistor and the first transistor further has a drain connected to a reset power supply (VR).

15. A circuit according to claim 1, wherein the floating diffusion constitutes the source of the first transistor and the first transistor further comprises a drain connected to a reset power supply (VR).

16. A circuit according to claim 11, further comprising means for determining the difference between two successive sample values from the sampling means to determine the signal charge transferred to the floating diffusion.

17. A charge coupled device comprising
a charge coupled transfer section transferring signal charges in synchronism with a drive clock applied thereto,
a first transistor having a floating diffusion,
the signal charges being transferred in succession to the floating diffusion in synchronism with the drive clock, and
the first transistor having a gate electrode connected to receive a reset clock ($\phi R'$), and
means for causing the reset clock to have an interval longer than the period of the drive clock.

* * * * *